(12) United States Patent
Kumasaka et al.

(10) Patent No.: US 6,960,871 B1
(45) Date of Patent: Nov. 1, 2005

(54) PIEZOELECTRIC TRANSFORMER

(75) Inventors: Katsunori Kumasaka, Soma (JP);
Masao Yamaguchi, Sendai (JP)

(73) Assignee: NEC TOKIN Corporation, Miyagi (JP)

( * ) Notice: Subject to any disclaimer, the term of this patent is extended or adjusted under 35 U.S.C. 154(b) by 0 days.

(21) Appl. No.: 09/701,420

(22) PCT Filed: May 31, 1999

(86) PCT No.: PCT/JP99/02888

§ 371 (c)(1),
(2), (4) Date: Jan. 27, 2000

(87) PCT Pub. No.: WO99/63603

PCT Pub. Date: Sep. 12, 1999

(30) Foreign Application Priority Data

May 29, 1998 (JP) .................................. 9-149660
Mar. 12, 1999 (JP) .................................. 10-67217

(51) Int. Cl.[7] ............................................ H01L 41/08
(52) U.S. Cl. ...................................... 310/359; 310/366
(58) Field of Search ............................... 310/358, 359, 310/366, 345, 348; 318/328, 359, 366

(56) References Cited

U.S. PATENT DOCUMENTS

| | | | |
|---|---|---|---|
| 3,660,699 A | * | 5/1972 | Sakurai et al ........... 310/345 X |
| 3,836,794 A | * | 9/1974 | Shimizu et al .......... 310/345 X |
| 5,757,106 A | * | 5/1998 | Sato et al .................... 310/359 |
| 5,818,150 A | * | 10/1998 | Yamamoto et al .......... 310/359 |
| 5,929,554 A | * | 7/1999 | Kanayama et al .......... 310/359 |
| 6,097,132 A | * | 8/2000 | Inoi et al .................... 310/345 |

FOREIGN PATENT DOCUMENTS

| | | |
|---|---|---|
| EP | 99923856 | 11/1997 |
| JP | 9-64433 | 3/1997 |
| JP | 9-83033 | 3/1997 |
| JP | 9-298327 | 11/1997 |
| JP | 1022539 | 1/1998 |

* cited by examiner

Primary Examiner—Mark Budd
(74) Attorney, Agent, or Firm—Bradley N. Ruben

(57) ABSTRACT

A piezoelectric transformer (101) comprises a layered structure (15) formed by alternately stacking a plurality of internal electrodes (13) and a plurality of piezo-electric ceramics layers (103) in thickness direction, first electrodes (21, 23) formed on side surfaces of said layered structure (15) and connected to said internal electrodes (13), at least one pair of second electrodes (27, 29, 31, 33, 35, 37) formed on the side surfaces in areas different from those of the first electrodes (21, 23) and having a same potential, and a circuit board for driving the piezoelectric transformer. The piezoelectric transformer (101) is mounted on the circuit board. Each of the at least one pair of the second electrodes (27, 29, 31, 33, 35, 37) opposite to each other is electrically connected to the circuit board.

14 Claims, 5 Drawing Sheets

MODIFIED ROSEN TYPE

ROSEN TYPE

IIIB-IIIB SECTION

IIIC-IIIC SECTION

PIEZOELECTRIC TRANSFORMER

TECHNICAL FIELD

This invention relates to a piezoelectric transformer used in an inverter circuit or an adapter power supply circuit for a cold cathode tube as a backlight of a liquid crystal display panel in a notebook-type personal computer or a car-navigation system, a high voltage generating circuit for an electronic copying machine, and the like and, particularly, to a structure of an output electrode of such a transformer and mounting of such a transformer onto a circuit board.

BACKGROUND ART

Conventionally, a piezoelectric transformer has been used in a power supply of a variety of small-sized electronic apparatus. Typically, Rosen type and modified Rosen type transformers are known.

An example of the Rosen-type piezoelectric transformer comprises a rectangular piezoelectric ceramic plate, a pair of input-side electrodes formed on top and bottom surfaces thereof over an approximate half in its longitudinal direction, and an output-side electrode formed on an end surface of the other half where the above-mentioned pair of input-side electrodes are not formed. One of lead wires respectively connected to the pair of input-side electrodes serves as an input terminal of an input portion. One of lead wires connected to the output-side electrode serves as an output electrode kept at a high potential. The other lead wire connected to the input-side electrode serves as an input/output common terminal.

On the other hand, an example of the modified Rosen-type piezoelectric transformer comprises a layered structure formed by alternately stacking inner electrode films and piezoelectric ceramics. An approximate half of the layered structure in its longitudinal direction is used as an input portion while the other half is used as an output portion. In the input portion, every adjacent ones of the inner electrodes alternately stacked with the piezoelectric ceramics layers are extended or led to different side surfaces opposite to each other and connected to input electrodes formed on the side surfaces of the layered structure, respectively. On the other hand, the output portion comprises strip-like electrodes arranged in parallel in the longitudinal direction of the layered structure and alternately stacked with the piezoelectric ceramics layers. Both sides of these inner electrodes are exposed at the opposite side surfaces and connected to a pair of output electrodes, respectively, which are formed on the opposite side surfaces, respectively, and is opposite to each other. The input electrodes are provided with lead wires connected to an input side. The output electrodes are provided with lead wires connected to an output side. One of the lead wires of the output portion has a high potential while the adjacent lead wires have a low and a same potential.

However, a widened range of luminance control has been required to be processed for an inverter utilizing the piezoelectric transformer, which may often adopts burst adjustment of brightness increasingly so as to meet the requirement.

This results in a problem of generation of an audible sound, which has not occurred in a conventional mounting method. The reason is as follows. The vibration of the piezoelectric transformer has traditionally been excited in a single vibration mode in most cases. However, by addition of the brightness adjusting function, the vibration of the piezoelectric transformer is no longer a single mode vibration and thereby affects electrical junctions thereof.

In addition to the problem that the vibration mode is no longer a single mode vibration, there is another problem due to transition into a small and thin device of the piezoelectric transformer element that an area is limited for electrical connection upon an electrode structure thereof, thereby resulting in a problem in reliability of electrical connection between the piezoelectric transformer element and the circuit board.

Therefore, it is a primary object of the present invention to provide a piezoelectric transformer which can minimize the number of steps and the time required for mounting, as compared with a conventional mounting method.

It is a second object of the present invention to provide a mounting method of the above-mentioned piezoelectric transformer.

It is a third object of the present invention to provide a piezoelectric transformer which can reduce a sound pressure level of an audible sound without deteriorating electric characteristics such as a step-up ratio and heat generation, and can improve reliability.

It is a fourth object of the present invention to provide a piezoelectric transformer which can realize a very thin piezoelectric inverter.

It is a fourth object of the present invention to provide a power supply has a piezoelectric inverter utilizing the above-mentioned piezoelectric transformer.

DISCLOSURE OF THE INVENTION

According to the present invention, there is provided a piezoelectric transformer comprising a piezoelectric transformer body including a piezoelectric ceramics rectangular plate, a pair of first electrodes formed on at least one of top/bottom surfaces and both side surfaces of an approximate half of the transformer body in its longitudinal direction, and at least one second electrode formed on at least one of side surfaces and an end surface of the other approximate half of the transformer in its longitudinal direction, wherein the piezoelectric transformer is mounted on a circuit board with a power supply circuit component mounted thereon to drive the piezoelectric transformer, the second electrode being provided with a plurality of terminals each of which is connected to the circuit board.

In the piezoelectric transformer of the present invention, the transformer body preferably comprises one of a layered structure formed by alternately stacking a plurality of inner electrodes and a plurality of piezoelectric ceramic layers in a thickness direction, and a single piezoelectric ceramics layer.

In the present invention, it is preferable that the piezoelectric transformer is driven in a half-wavelength or a one-wavelength vibration mode, and comprises a fixing member formed by an elastic material having flexibility and interposed between the piezoelectric transformer and the circuit board in order to mount the piezoelectric transformer on the circuit board, the piezoelectric transformer being fixed by the fixing member on the circuit board, the fixing component being located within each of areas occupying ⅕ of the full length from both ends of the piezoelectric transformer and being formed in a spot-like or a linear fashion.

According to the present invention, there is also provided a piezoelectric transformer mounting method in which a piezoelectric transformer driven in a half-wavelength or a one-wavelength mode is mounted on a circuit board with a power supply circuit component mounted thereon to drive the piezoelectric transformer, the piezoelectric transformer being fixed to the circuit board through a fixing member formed by an elastic material having flexibility and interposed between the piezoelectric transformer and the circuit board in order to mount the piezoelectric transformer, wherein the fixing member is located within each of areas occupying ⅕ of the full length from both ends of the piezoelectric transformer and formed in a spot-like or a linear fashion.

Thus, according to the present invention, in order to mount the piezoelectric transformer on the circuit board with the power supply circuit component mounted thereon to drive the piezoelectric transformer, the flexible elastic material in a spot-like or a linear fashion is disposed within each of areas occupying ⅕ of the full length from the both ends except a portion corresponding to a vibration node of the piezoelectric transformer. Thus, the piezoelectric transformer and the circuit board are fixed to each other and the piezoelectric transformer is supported. With this structure, the support member can be omitted. It is therefore possible to facilitate the process of mounting the piezoelectric transformer and to shorten the time necessary for mounting. In addition, the supporting area is enlarged as compared with the conventional supporting structure. Therefore, the mounting method is more effective in absorbing the excitation which is not in a single mode and is capable of decreasing the abnormal vibration.

BEST MODE FOR EMBODYING THE INVENTION

For the purpose of describing embodiments of the present invention, description will hereinafter be made about conventional piezoelectric transformers with reference to FIGS. 1 and 2 in order to facilitate an understanding of the present invention.

Figure 1:
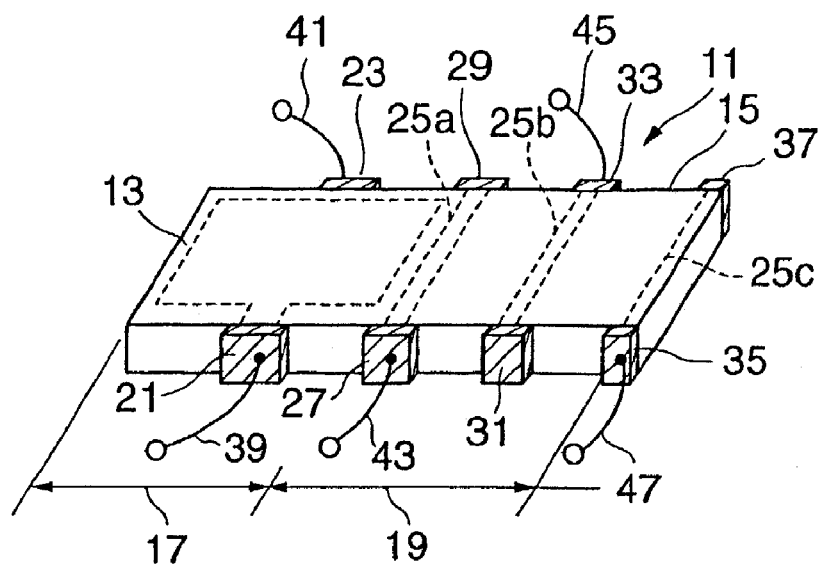
FIG. 1 is a perspective view showing a terminal structure of a conventional modified Rosen-type piezoelectric transformer.

Referring to FIG. 1, a piezoelectric transformer 11 as an example of a modified Rosen type comprises a layered structure 15 formed by alternately stacking inner electrodes 13 and piezoelectric ceramics layers. An approximate half of the layered structure 15 in a longitudinal direction serves as an input portion 17 and the other half serves as an output portion 19.

In the input portion 17, every adjacent ones of the inner electrodes 13 alternately stacked with the piezoelectric ceramics layers are extended or led to different side surfaces opposite to each other and connected to input electrodes 21 and 23 formed on the side surfaces of the layered structure 15, respectively.

On the other hand, the output portion 19 is provided with strip-like electrodes 25a, 25b, and 25c arranged in parallel to one another in the longitudinal direction of the layered structure 15 and alternately stacked with the piezoelectric ceramics layers. Both sides of these electrodes 25a, 25b, and 25c are exposed at the opposite side surfaces and connected to pairs of output electrodes 27 and 29, 31 and 33, and 35 and 37 formed on the opposite side surfaces to be opposite to each other.

In order to electrically connect the piezoelectric transformer 11 shown in FIG. 1 to a circuit board which is not shown in the figure, the input electrodes 21 and 23 are respectively provided with the lead wires 39 and 41 which are connected to an input side while the output electrodes 27, 33, and 35 are respectively provided with lead wires 43, 45, and 47 which are connected to an output side. The lead wire 45 of the output portion 19 has a relatively high potential. The lead wires 43 and 47 have a relatively low and same potential.

As a terminal structure and electrical connection of the output portion 19, the lead wires 43, 45, and 47 are connected to the circuit board.

Figure 2:
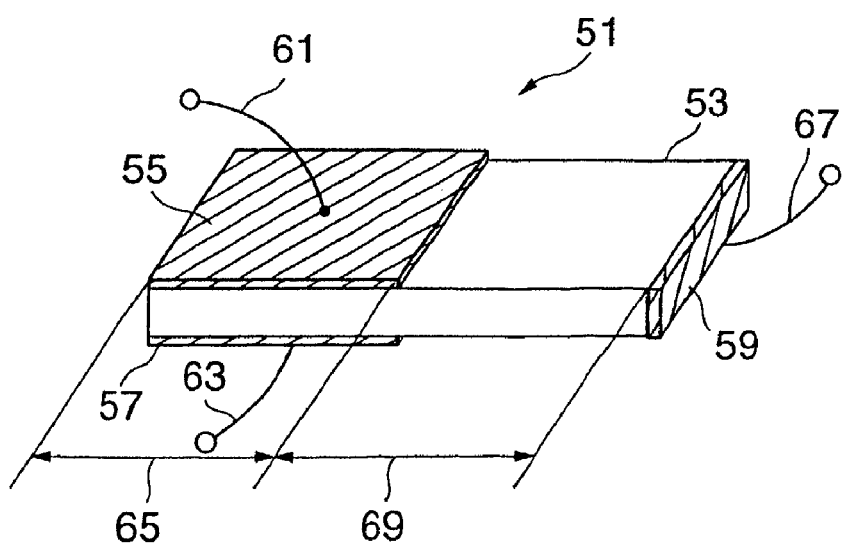
FIG. 2 is a perspective view showing a terminal structure of a conventional Rosen-type piezoelectric transformer.

A piezoelectric transformer 51 shown in FIG. 2 is called a Rosen type and is well known as well as the piezoelectric transformer element in FIG. 1. As shown in FIG. 2, the piezoelectric transformer 51 as an example of a Rosen-type comprises a rectangular piezoelectric ceramic plate 53, a pair of electrodes 55 and 57 formed on top and bottom surfaces of an approximate half thereof in its longitudinal direction, and an electrode 59 formed on an end surface at the side where these electrodes 55 and 57 are not formed. In the piezoelectric transformer 51 of the above-mentioned structure, lead wires 61 and 63 connected to the pair of electrodes 55 and 57 serve as input terminals of an input portion 65 while a lead wire 67 connected to the electrode 59 serves as an output terminal of an output portion 69 and is kept at a high potential.

Description will be made about embodiments of the present invention with references to FIGS. 3A, 3B, and 3C through FIGS. 8A and 8B.

Figure 3A:
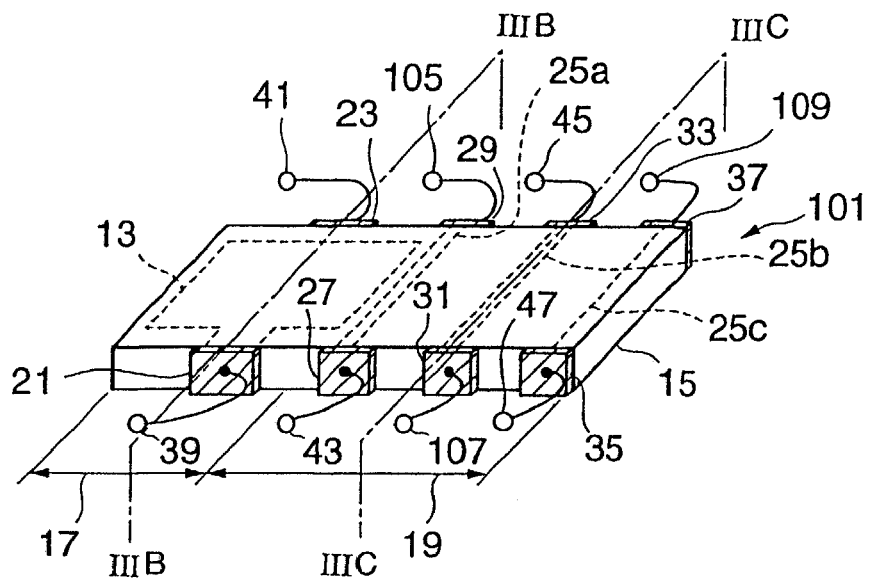
FIG. 3A is a perspective view showing a terminal structure of a modified Rosen-type piezoelectric transformer according to a first embodiment of the present invention.
Figure 3B:
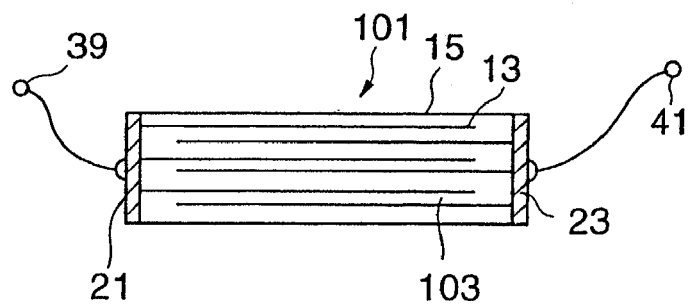
FIG. 3B is a sectional view taken along a line IIIB—IIIB in FIG. 3A.
Figure 3C:
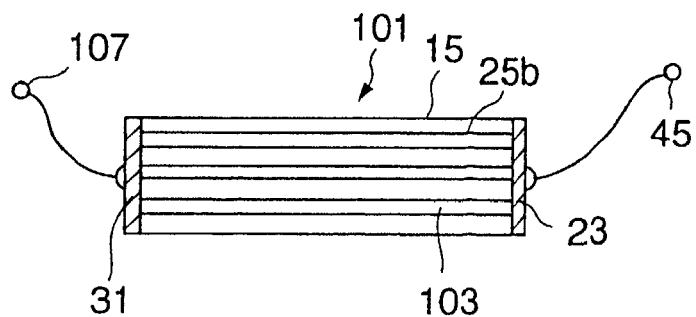
FIG. 3C is a sectional view taken along a line IIIC—IIIC in FIG. 3A, showing a section of a high voltage portion of an output side.

Referring to FIGS. 3A, 3B, and 3C, a piezoelectric transformer 101 according to a first embodiment of the present invention is a modified Rosen-type piezoelectric transformer.

The piezoelectric transformer 101 comprises rectangular inner electrodes 13, strip-like connection electrodes 25a, 25b, and 25c, and piezoelectric ceramics layers 103 alternately stacked to form a layered structure 15. An approximate half of the layered structure 15 in a longitudinal direction serves as an input portion 17 and the other half serves as an output portion 19. Each piezoelectric ceramics layer 103 is made of lead zirconate titanate. The connection electrodes 25a, 25b, and 25c are made of silver-palladium. Each of external electrodes 21, 23, 27, 29, 31, 33, 35, and 37 is made of silver or silver-palladium.

In the input portion 17, every adjacent one of the inner electrodes 13 alternately stacked with the piezoelectric ceramics layers 103 are extended or led to different side surfaces opposite to each other and connected to the input electrodes 21 and 23 formed on the side surfaces of the layered structure 15, respectively. The input electrodes 21 and 23 are provided with the lead wires 39 and 41, respectively.

On the other hand, the output portion 19 is provided with strip-like electrodes 13 arranged in parallel in the longitudinal direction of the layered structure 15 and alternately stacked with the piezoelectric ceramics layers 103. Both sides of these connection electrodes 13 are exposed at the opposite side surfaces of the layered structure 15 and connected to pairs of output electrodes 27 and 29, 31 and 33, and 35 and 37 formed on the opposite side surfaces to be opposite to each other. The output electrodes 27 and 29, 31 and 33, and 35 and 37 are connected to lead wires 43 and 105, 107 and 45, and 47 and 109, respectively. The output portion 19 has a high-voltage portion including the electrodes 31 and 33. The electrodes 31 and 33 are electrically connected to each other.

The electrodes 27, 29, 35, and 37 in a low-voltage portion are similar in structure to the above-described electrodes 31 and 33.

Figure 4:
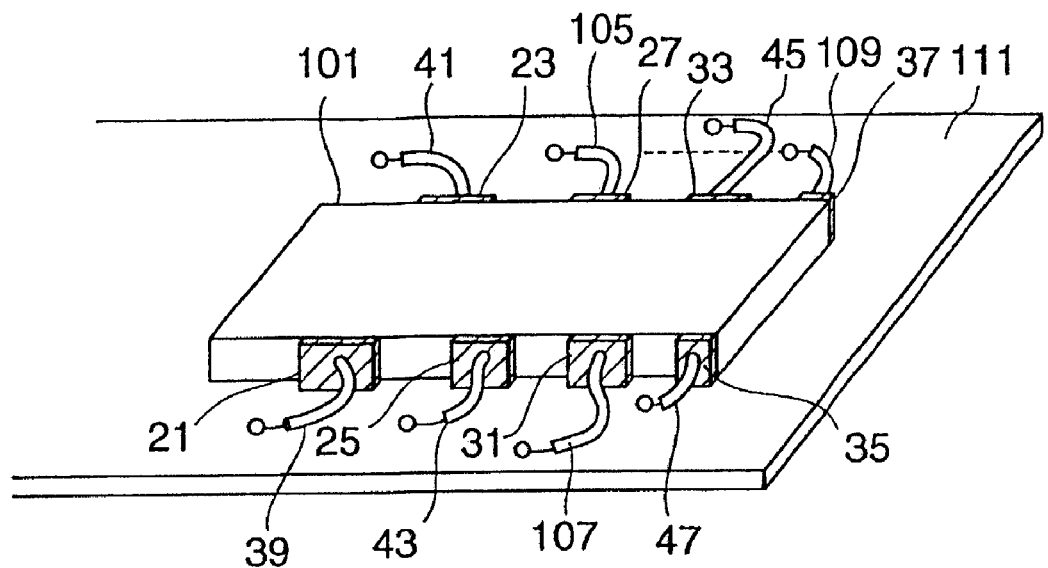
FIG. 4 is a perspective view showing the state in which the modified Rosen-type piezoelectric transformer in FIG. 3A is mounted on a circuit board.

Referring to FIG. 4, illustrated is the state in which the piezoelectric transformer 101 in FIG. 3A is mounted on a circuit board 111. The lead wires 39 and 41, 43 and 105, 107 and 45, and 47 and 109, which are processed to have predetermined lengths, are soldered to eight points, i.e., the external electrodes 21, 23, 24, 27, 29, 31, 33, and 35, respectively, of the piezoelectric transformer 101 shown in FIG. 3A. Next, by the use of a silicon adhesive via a silicon sheet, the piezoelectric transformer 101 with leads connected is adhered to the circuit board 111 (see FIG. 4) 30 at the vibration nodes. The lead wires 39 and 41, 43 and 105, 107 and 45, and 47 and 109 are soldered to eight designated points on the circuit board 111. Herein, the lead wires are soldered in the first embodiment. Alternatively, a flexible printed circuit board (FPC) can also be soldered and connected.

Figure 5:
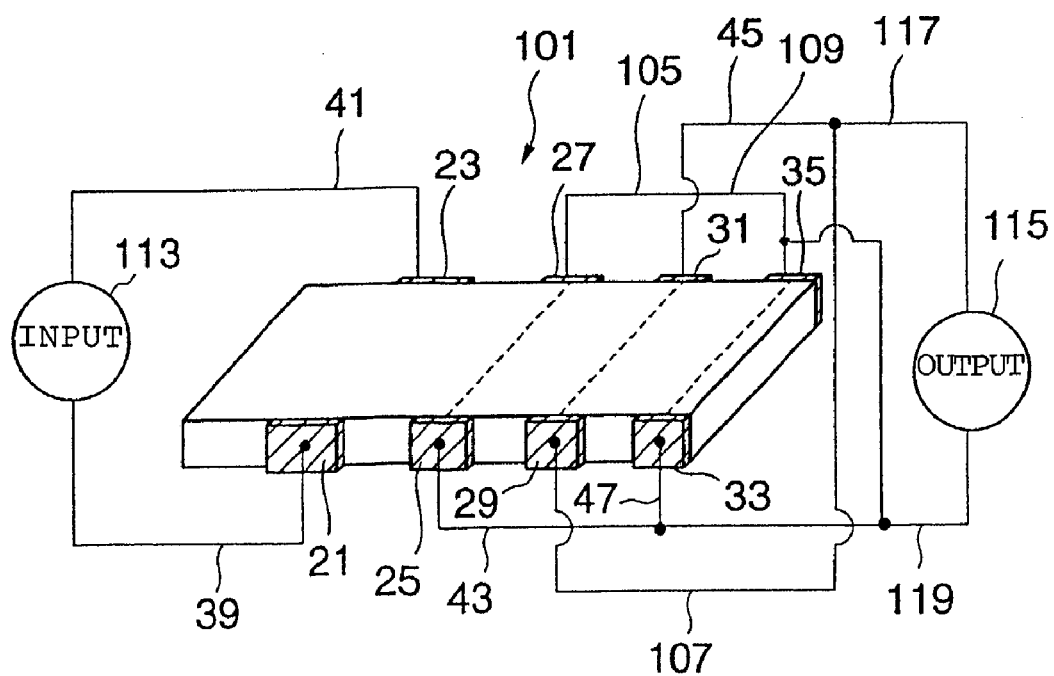
FIG. 5 is a wiring diagram of the modified Rosen-type piezoelectric transformer shown in FIG. 4.

FIG. 5 is a circuit diagram of an inverter power supply utilizing the piezoelectric transformer in FIG. 4.

As shown in FIG. 5, the input-side lead wires 39 and 41 are connected to an input-side circuit 113. The output-side lead wires 107 and 117 are collected and are inputted through a single connection line 117 to one end of an output-side circuit. The output-side lead wires 105 and 109 are short-circuited. The output-side lead wires 43 and 47 are collected into a single connection line 119 which is inputted to the other end of the output-side circuit.

In the piezoelectric transformer of the above-described structure according to the first embodiment of the present invention, the output portion 19 of the modified Rosen type piezoelectric transformer 101 has an electrode structure in which the external electrodes of the output portion 19 are arranged on both sides as shown in FIGS. 3A, 3B, and 3C. The output side 12 of the piezoelectric transformer element has an internal structure as shown in FIG. 3C. Electrical connection is established between the lead wires 43 and 105, between 107 and 45, and between 47 and 109. With this structure, the vibration of the piezoelectric transformer is symmetrical in the longitudinal direction so that the sound pressure of an audible sound can be reduced. In addition, the output portion 19 has two electrical connections at each part, i.e., the high-potential lead wires 107 and 45, the low-potential lead wires 43 and 105, and the low-potential lead wires 47 and 109. Therefore, even if any trouble occurs at one of the electrical connections, electrical characteristics of the piezoelectric transformer will not change.

Next, the characteristics of the piezoelectric transformer element according to the first embodiment of the present invention are shown in following Table 1. As shown in Table 1, it is obvious that, in the modified Rosen type piezoelectric transformer element, the audible sound can be reduced by approximately 8 dB, no degradation is observed in electrical characteristics such as a step-up ratio and heat generation, and the reliability is improved.

TABLE 1

| ITEM | EXISTING PRODUCT | PRODUCT OF PRESENT INVENTION |
| --- | --- | --- |
| STEP-UP RATIO | 90 | 91 |
| DRIVING FREQUENCY (kHz) | 64.5 | 64.5 |
| HEAT GENERATION (° C.) | 18 | 17 |
| AUDIBLE SOUND (dB) | 70 | 62 |

Figure 6:
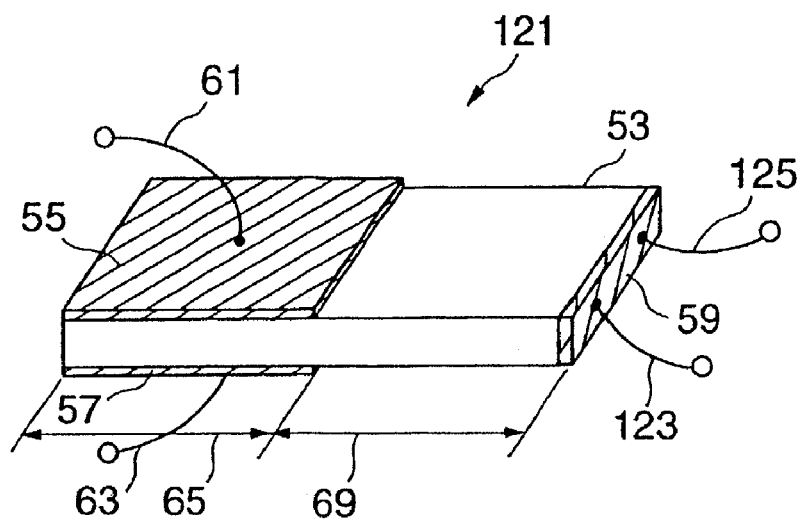
FIG. 6 is a perspective view showing a terminal structure of a piezoelectric transformer according to a second embodiment of the present invention.

Referring to FIG. 6, a piezoelectric transformer 121 of a second embodiment of the present invention is called a Rosen type. The transformer element 121 comprises a rectangular piezoelectric ceramic plate 53 with electrodes 55 and 57 formed on top and bottom surfaces of an approximate half of the plate in a longitudinal direction. On the other hand, an electrode 59 is formed on an end surface of the rectangular piezoelectric ceramic plate 53 at the side where the electrodes 55 and 57 are not formed. The transformer is different from the conventional piezoelectric transformer 51 shown in FIG. 2 in that the electrode 59 is provided with two lead wires 123 and 125.

In the piezoelectric transformer 121 of the above-described structure, lead wires 61 and 63 connected to the electrodes 55 and 57 serve as input terminals of an input portion 65. The lead wires 123 and 125 connected to the electrode 59 are kept at a high potential and serve as output terminals together with one of the input terminals used as a common terminal.

Figure 7:
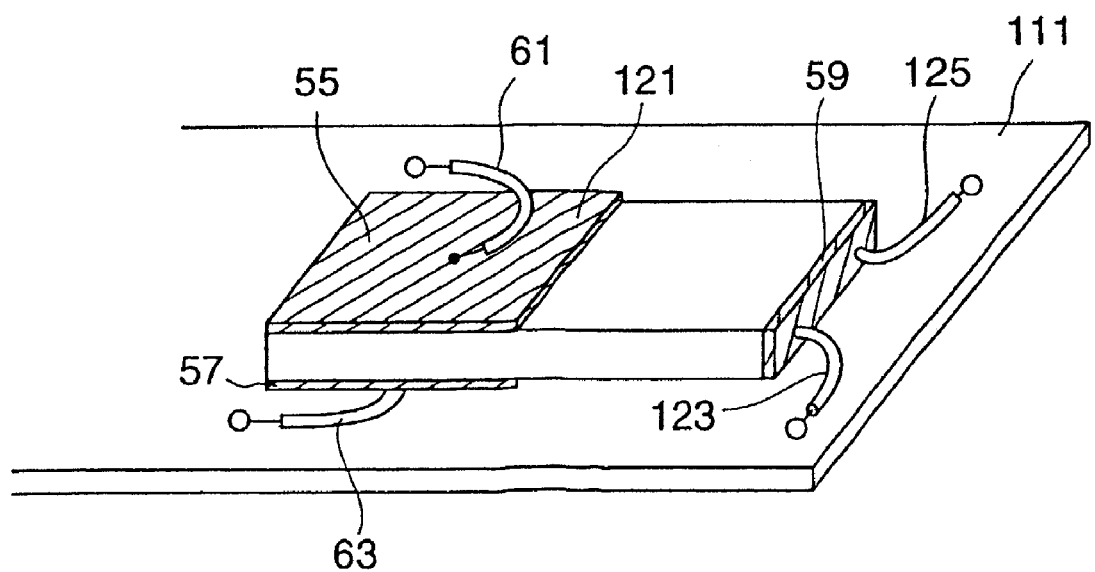
FIG. 7 is a perspective view showing the state in which the piezoelectric transformer in FIG. 6 is mounted on a circuit board.

Referring to FIG. 7, illustrated is the state in which the piezoelectric transformer 121 in FIG. 6 is mounted on a circuit board 111.

As shown in FIGS. 6 and 7, the lead wires 123 and 125 are connected at two positions at the output side of the Rosen type piezoelectric transformer 121. With this structure, it can provide a piezoelectric transformer in which the electrical characteristics do not changes even if the trouble has occurred at one position of the electrical connection.

In the second embodiment of the present invention, it is also found out that no degradation is observed in the electrical characteristics as compared with the existing technique and the reliability is improved.

As described above, according to the first and the second embodiments of the present invention, it is possible to provide a piezoelectric transformer which has a symmetrical structure with respect to the vibration of the piezoelectric transformer so that the sound pressure level of the audible sound, which has been an outstanding problem, can be reduced, no degradation is observed in the electrical characteristics, and the reliability can be improved.

According to the first and the second embodiments of the present invention, it is also possible to provide a piezoelectric transformer which can realize a very thin piezoelectric inverter.

Figure 8A:
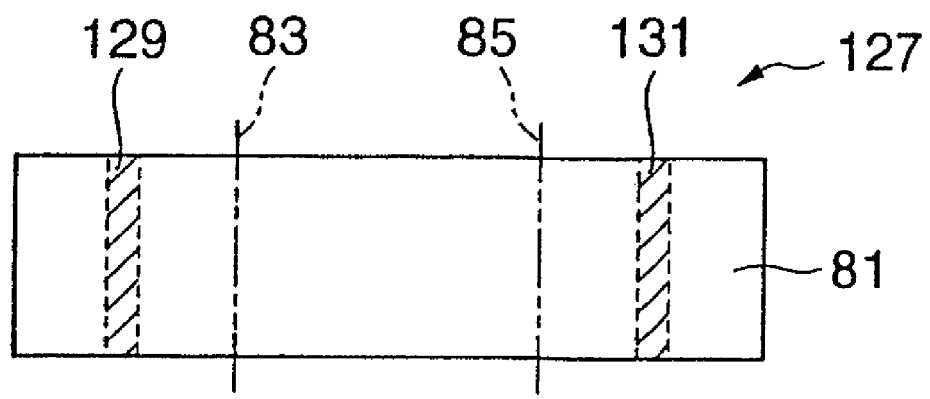
FIG. 8A is a plan view showing the state in which a piezoelectric transformer according to a third embodiment of the present invention is mounted on a circuit board.
Figure 8B:
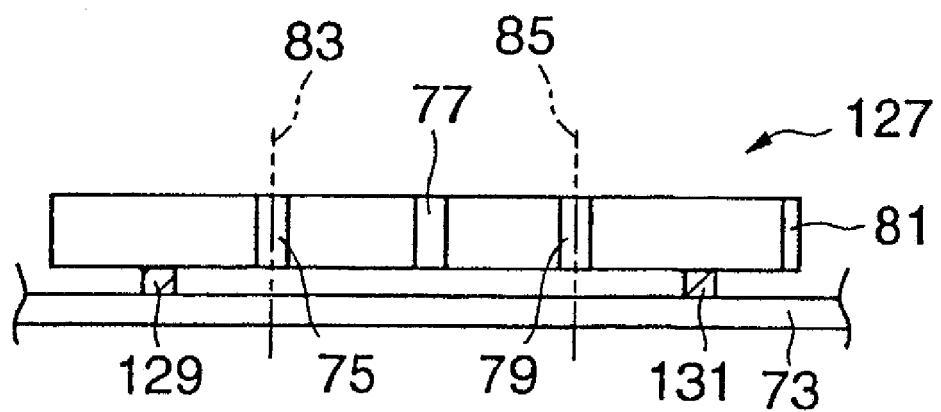
FIG. 8B is a side view of the piezoelectric transformer shown in FIG. 8A.

Referring to FIGS. 8A and 8B, a piezoelectric transformer 127 according to a third embodiment of the present invention is similar in structure to that of the existing technique shown in FIGS. 3A and 3B except that a board mounting structure is different. Specifically, the piezoelectric transformer 127 is provided with external electrodes 75, 77, 79, and 81 formed on both of front and back side surfaces of the transformer. Herein, lead wires are also soldered to these external electrodes 75, 77, 79, and 81 but are not shown.

In the manner similar to the existing piezoelectric transformer 71, a power supply such as a piezoelectric inverter is obtained by mounting the piezoelectric transformer 127 on a circuit board 10 provided with circuit components for driving the piezoelectric transformer.

However, in the third embodiment of the present invention, the piezoelectric transformer 127 is mounted on the circuit board 73 in the manner different from the existing technique. Specifically, fixing members 129 and 131 made of a flexible elastic material are inserted under and adhered to a bottom surface of the piezoelectric transformer 127 at positions nearer to both ends thereof than vibration nodes 83 and 85 in a half-wavelength mode.

As a specific example of the third embodiment of the present invention, the piezoelectric transformer 127 having a three-dimension size of 53/7.7/3.2 mm was mounted on the circuit board 73. Thereafter, characteristics of the example of the third embodiment of the present invention were compared as shown in Table 2 below.

TABLE 2

| ITEM | EXISTING PRODUCT | PRODUCT OF PRESENT INVENTION |
|---|---|---|
| CURRENT CONSUMPTION (mA) | 1.05 | 1.02 |
| HEAT GENERATION (° C.) | 30 | 32 |
| AUDIBLE SOUND (dB) | 50 | 49 |
| VIBRATION RATE IN LONGITUDINAL DIRECTION (m/s) | 0.364 | 0.357 |
| VIBRATION RATE IN WIDTH DIRECTION (m/s) | 0.063 | 0.058 |
| VIBRATION RATE IN THICKNESS DIRECTION (m/s) | 0.027 | 0.024 |

As shown in the above Table 2, the piezoelectric transformer according to the third embodiment of the present invention exhibits no substantial change in heat generation of the piezoelectric transformer, current consumption, and the waveform of the vibration rate in the longitudinal direction, as compared with the existing product. It is also understood that, as compared with the existing product, the vibration in each of the width and the thickness directions is suppressed and the level of the audible sound is reduced.

As described above, according to the third embodiment of the present invention, in the piezoelectric transformer for use in the piezoelectric inverter and the power supply comprising the piezoelectric transformer mounted on the circuit board equipped with the circuit components for driving the piezoelectric transformer, use is made of the mounting method in which the flexible elastic material not only serving as a fixing member but also as a supporting member is inserted and adhered to the transformer within each of areas occupying ⅕ of the full length of the transformer from the both ends thereof. With this mounting method, it is possible to provide a mounting structure of the piezoelectric transformer, which can suppress the audible sound and the vibration in each of the width and the thickness directions without changing the character-istics such as the heat generation and the vibration in the longitudinal direction and which can minimize, by omitting the supporting member, the number of mounting steps and the time required for mounting.

INDUSTRIAL APPLICABILITY

As described above, the piezoelectric transformer and its mounting structure according to the present invention are useful as a piezoelectric transformer used in an inverter circuit or an adapter power supply circuit for a cold cathode tube as a backlight for a liquid crystal display panel in a notebook-type personal computer or a car-navigation system and used in a high-voltage generating circuit for an electronic copying machine.

What is claimed is:

1. A piezoelectric transformer driven in a half-wavelength or a one-wavelength vibration mode, said transformer comprising a fixing member made of an elastic material having flexibility and being interposed between the piezoelectric transformer and said circuit board in order to mount said piezoelectric transformer on said circuit board, said piezoelectric transformer being fixed by said fixing member onto said circuit board, the fixing member being located within each of areas occupying ⅕ of the full length of said transformer from both ends thereof and formed in a spot-like or a linear fashion.

2. A piezoelectric transformer mounting structure in which a piezoelectric transformer driven in a half-wavelength or a one-wavelength mode is mounted on a circuit board with a power supply circuit component mounted thereon to drive said piezoelectric transformer, said piezoelectric transformer being fixed to said circuit board through a fixing member made of an elastic material having flexibility and interposed between said piezoelectric transformer and said circuit board in order to mount said piezoelectric transformer, wherein said fixing member is located within each of areas occupying ⅕ of the full length of said piezoelectric transformer from both ends thereof and formed in a spot-like or linear fashion.

3. A piezoelectric transformer as claimed in claim 1, said piezoelectric transformer comprising a piezoelectric transformer body including a piezoelectric ceramic rectangular plate, a pair of first electrodes formed on at least one of top and bottom surfaces and both side surfaces of a first approximate half of the transformer body in its longitudinal direction, and at least one second electrode formed on at least one of said side surfaces and an end surface of a second approximate half of the transformer body in its longitudinal direction, wherein the piezoelectric transformer is mounted on a circuit board with a power supply circuit component mounted thereon to drive the piezoelectric transformer, the second electrode being provided with a plurality of connection elements, each of which is connected to said circuit board.

4. A piezoelectric transformer as claimed in claim 3, wherein said piezoelectric transformer body comprises one of a layered structure formed by alternatively stacking a plurality of inner electrodes and a plurality of piezoelectric ceramic layers in a thickness direction, or a single piezoelectric ceramics layer.

5. A piezoelectric transformer as claimed in claim 4, wherein said piezoelectric transformer and said circuit board are electrically connected by at least one of a lead wire and a FPC.

6. A piezoelectric transformer as claimed in claim 5, wherein said piezoelectric transformer body comprises said layered structure, said first electrodes being formed on opposite side surfaces of said layered structure and being connected to said inner electrodes, said second electrode comprising at least one pair of electrodes which are formed on the side surfaces in areas different from those of said first electrodes of said layered structure and which are kept at a same potential and connected to said circuit board.

7. A piezoelectric transformer as claimed in claim 6, wherein a plurality of pairs of said second electrode are arranged in parallel to one another in the longitudinal direction, each pair of said second electrode being connected to output terminals, and adjacent pairs of said second electrode being connected to said circuit board.

8. A piezoelectric transformer as claimed in claim 7, wherein said piezoelectric transformer forms an inverter power supply.

9. The piezoelectric transformer of claim 1, wherein said piezoelectric transformer comprises a body including a piezoelectric ceramic rectangular plate, a pair of first electrodes formed on both side surfaces of an approximate half of the transformer body in its longitudinal direction, and at least two pairs of second electrodes formed on both side surfaces of the other approximate half of the transformer body in its longitudinal direction, the piezoelectric transformer being mounted on a circuit board with a power supply circuit component mounted thereon to drive the piezoelectric transformer, the second electrodes being provided with connection elements, respectively, each of the connection elements being connected to said piezoelectric transformer body comprising a layered structure formed by alternately stacking a plurality of inner electrodes and a plurality of piezoelectric ceramic layers in a thickness direction, said piezoelectric transformer and said circuit board being electrically connected by the connection elements comprising at least one of a lead wire and a FPC, wherein said piezoelectric transformer body comprises said layered structure, said first electrodes being formed on the opposite side surfaces of said layered structure and being connected to said internal electrodes, said second electrodes being formed on the side surfaces in areas different from those of said first electrodes of said layered structure and which are kept at a same potential and connected to said circuit board.

10. The piezoelectric transformer as claimed in claim 9, wherein a plurality of pairs of said second electrode are arranged in parallel to one another in the longitudinal direction, each pair of said second electrode having a pair of the connection elements being connected to each other so as to have a same potential, and adjacent pairs of said second electrode being connected to said circuit board by the pair of connection elements as output terminals different from each other.

11. The piezoelectric transformer as claimed in claim 10, wherein said piezoelectric transformer forms an inverter power supply.

12. The piezoelectric transformed as claimed in claim 9, wherein said second electrode comprises a single output electrode formed at one end of said piezoelectric transformer body, said output electrode being provided with two terminals, said two terminals being electrically connected to said circuit board.

13. The piezoelectric transformer as claimed in claim 12, wherein said first electrode comprises a pair of input electrodes formed on a part of top and bottom opposite surfaces of said piezoelectric transformer body to be opposite to each other.

14. The piezoelectric transformer as claimed in claim 13, wherein said piezoelectric transformer is used in an inverter power supply.

* * * * *